United States Patent [19]
Bushey et al.

[11] Patent Number: 5,898,617
[45] Date of Patent: Apr. 27, 1999

[54] SENSING CIRCUIT AND METHOD

[75] Inventors: Thomas P. Bushey, Phoenix; James S. Caravella, Chandler; David F. Mietus, Phoenix, all of Ariz.

[73] Assignee: Motorola, Inc., Schaumburg, Ill.

[21] Appl. No.: 08/859,962

[22] Filed: May 21, 1997

[51] Int. Cl.$^6$ .................................................. G11C 16/06
[52] U.S. Cl. ............................. 365/185.2; 365/185.21; 365/185.22; 365/210
[58] Field of Search ................... 365/185.2, 185.21, 365/185.22, 210

[56] References Cited

U.S. PATENT DOCUMENTS

| | | | |
|---|---|---|---|
| 5,142,495 | 8/1992 | Canepa | 365/185.2 |
| 5,557,568 | 9/1996 | Miyamoto et al. | 365/185.22 |
| 5,654,919 | 8/1997 | Kwon | 365/185.2 |
| 5,675,535 | 10/1997 | Jinbo | 365/185.2 |

*Primary Examiner*—Son T. Dinh
*Attorney, Agent, or Firm*—Robert D. Atkins; Robert F. Hightower

[57] ABSTRACT

A circuit (28) and method of sensing data stored in a memory circuit provide a reference current ($I_{REF}$) that tracks memory cell current ($I_{BIT}$) over a range of temperatures and power supply voltages. A comparator circuit (66) senses the memory cell current with respect to the reference current to produce the stored data ($V_{DATA}$) By sensing current rather than voltage, the voltage swing on a high capacitance bitline (39) can be reduced to improve speed. The reference current is set during testing of the circuit by applying programming voltages ($V_{WELL}$, $V_{CG}$, $V_{BL}$) to a reference device (52) that matches a storage device (36) in the memory cell (30).

16 Claims, 3 Drawing Sheets

SENSING CIRCUIT AND METHOD

BACKGROUND OF THE INVENTION

The present invention relates in general to integrated circuits, and more particularly to sensing data stored in nonvolatile memory circuits.

Many wireless communications systems are using digital techniques to increase functionality and noise immunity while reducing cost. For example, cellular telephones and pagers receive radio frequency carrier signals modulated with digital data. A demodulator extracts the data and a digital signal processor executes a software program to convert the data to audio and display signals.

Portable wireless communications devices store the software program and other data in a nonvolatile memory circuit that operates from a low voltage battery, e.g., 1.8 volts, and has minimum current drain for extending the operating time between battery recharges. Data is stored in electrically erasable, floating gate storage transistors by applying high-voltage programming signals to induce a stored charge that controls the conduction of the transistor.

Prior art memory circuits read the stored data by driving a bitline with the storage transistor to produce a voltage swing that can be sensed and compared with a reference voltage to produce the data. However, bitline voltage transitions are slow and increase access time because of the need to discharge large bitline capacitances through the storage transistor. Such bitline discharging not only slows memory access, but also consumes power and reduces battery operating time.

Hence, there is a need for a memory circuit that can sense data stored in a memory cell while reducing bitline voltage swings in order to reduce power and improve performance.

DETAILED DESCRIPTION OF THE DRAWINGS

Figure 1:
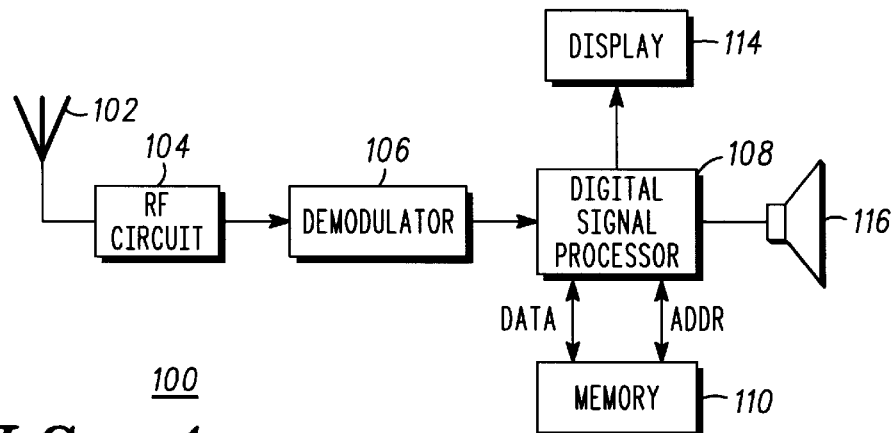
FIG. 1 is a block diagram of a wireless communications device.

FIG. 1 is a block diagram of a wireless communication device 100 such as a cellular telephone, two-way radio or pager. A receiver circuit in communications device 100 includes an antenna 102, a radio frequency (RF) circuit 104 and a demodulator 106. Antenna 102 receives a transmitted RF carrier signal modulated with digital information. RF circuit 104 amplifies the RF carrier signal and converts the frequency down to an intermediate frequency (IF) signal which is applied to an input of demodulator 106. Demodulator 106 extracts the digital information from the IF signal to produce baseband digital data which is applied to an input of a digital signal processor (DSP) circuit 108.

DSP 108 operates under the control of software program instructions stored in a nonvolatile memory circuit 110. The instructions are addressed by sending an ADDR logic signal to memory circuit 110. Addressed DATA, including the software instructions, is transferred between DSP 108 and memory circuit 110 on a data bus. DSP 108 produces video and control signals for driving a display device 114, such as a light-emitting diode or liquid crystal display. An audio output produces audio signals to drive a speaker 116.

Figure 2:
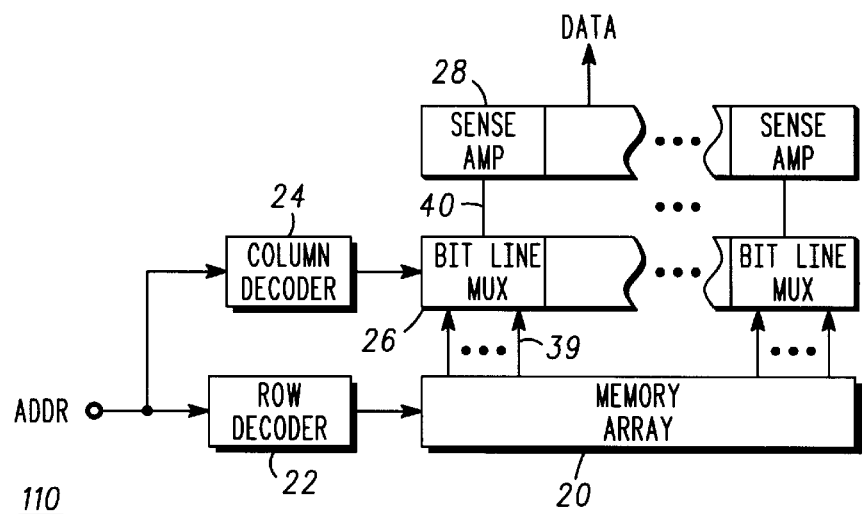
FIG. 2 is a block diagram of a memory circuit.

FIG. 2 is a block diagram of memory circuit 110 including a memory array 20, a row decoder 22, a column decoder 24, a plurality of bitline multiplexers 26 and a block of sense amplifiers 28. In the figures, elements having the same reference number perform similar functions. Memory array 20 includes a plurality of memory cells organized as a matrix of addressable rows and columns. A memory cell is selected by decoding ADDR with row and column decoders 22 and 24. The DATA stored in a selected memory cell is routed on an associated bitline 39 through a selected path in a bitline multiplexer 26 to conductor 40 at an input of a sense amplifier 28. Memory circuit 110 is configured to operate from a battery (not shown) supplying a power supply voltage $V_{DD}$=1.8 volts.

Figure 3:
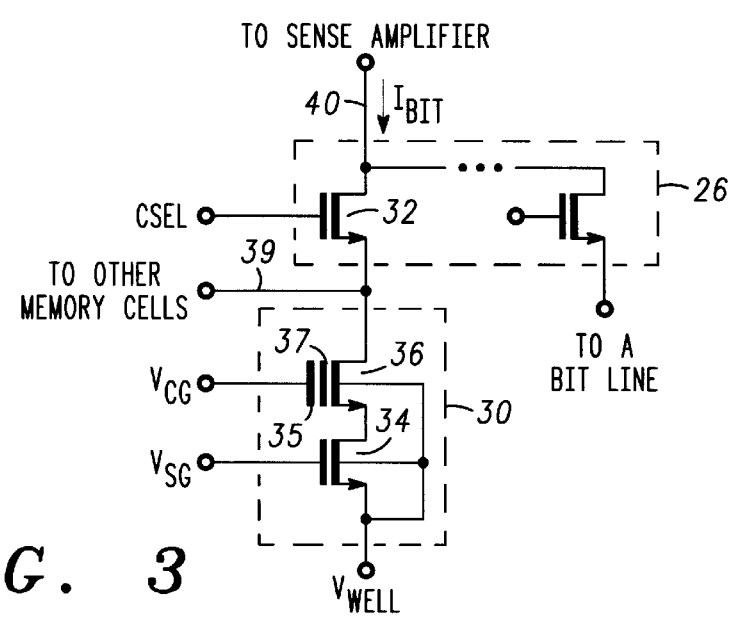
FIG. 3 is a schematic diagram of a nonvolatile memory cell and a column multiplexer.

FIG. 3 is a schematic diagram of a nonvolatile memory cell 30 of memory array 20 including NMOS transistors 34 and 36, and a bitline multiplexer 26 that includes a plurality of transistors coupled to a plurality of bitlines to couple a selected bitline to a sense amplifier 28 (not shown) in response to a column select signal CSEL.

Memory cell 30 stores DATA in a floating gate transistor 36 as a stored charge on a floating gate 37 that alters the conduction of transistor 36 to modulate a current $I_{BIT}$ flowing to bitline 39. Floating gate 37 is formed from polysilicon or similar material and is disposed between dielectric layers separating a control gate 35 from a drain of transistor 36. Transistors 34 and 36 are disposed in a p-well biased to a voltage $V_{WELL}$ whose magnitude depends on whether memory cell 30 is in a read or programming mode. Programming occurs after an erase cycle in which an array of memory cells is programmed to a zero state. A logic value of one is programmed by applying high voltage programming signals $V_{CG}$, $V_{WELL}$ and $V_{BL}$ (not shown) to control gate 35, to the p-well and to bitline 39, respectively, in accordance with the voltages shown in Table 1.

TABLE 1

| MODE | $V_{CG}$ | $V_{WELL}$ | $V_{BL}$ |
| --- | --- | --- | --- |
| Read | 1.8 | 0.0 | — |
| Erase | 13.0 | −5.0 | −5.0 |
| Program | −9.0 | 0.0 | 5.5 |

The dielectric layers surrounding floating gate 37 have essentially zero mobility, so that the stored charge remains on floating gate 37 after the programming voltages are removed. Therefore, transistor 36 maintains its level of conduction to retain its stored value even after power is removed.

Programming is a time dependent process in which several hundred microseconds or possibly several milliseconds are needed to fully charge or discharge floating gate 37. Typically, programming times are selected such that transistor 36 has zero conduction when zero charge is stored on floating gate 37 to represent one logic value arid maximum conduction when floating gate 37 is fully charged to represent another logic value. Zero conduction results in zero current $I_{BIT}$, and maximum conduction results in a maximum value of $I_{BIT}$, such as 30.0 microamperes. Therefore, to sense the value stored in memory cell 30, sense amplifier 28 discriminates between the minimum and maximum currents $I_{BIT}$=0.0 microamperes and $I_{BIT}$=30.0 microamperes.

It should be appreciated that if programming is terminated before floating gate 37 is fully charged, an intermediate analog type of value can be stored to produce an analog cell current. Consequently, the programming time can be controlled to set the conduction of transistor 36 to any desired value. Accordingly, transistor 36 can be used as an analog or digital storage device producing an analog or digital current.

Transistor 34 is a selection transistor that enables a conduction path in memory cell 30 in the read mode in response to a control signal $V_{SG}$. When memory cell 30 is not being read, transistor 34 blocks conduction to reduce power drain due to leakage currents of transistor 36. In an alternative embodiment, a memory cell can be implemented as a single floating gate transistor without a selection transistor. As a further alternative, a memory cell can be implemented with the select transistor coupled to the drain of the floating gate transistor.

Bitline multiplexer 26 includes a plurality of transistors including bitline transistor 32 whose drain electrodes are commonly connected to a node 40 at an input of sense amplifier 28. Each source electrode is coupled to a bitline and each gate electrode receives a column select signal for coupling a selected bitline to node 40. For example, the source of transistor 32 is coupled to bitline 39 and the gate electrode receives column select signal CSEL to route bitline 39 to node 40. Bitline 39 has a large capacitance which effectively loads node 40 when transistor 32 is on.

To read the stored data, most prior art memory circuits rely on voltage mode sensing in which a memory cell is selected to produce a bitline voltage swing which is compared with a reference voltage to sense the data. For example, a bitline can be precharged to a reference voltage of $V_{DD}/2$ such that when the memory cell discharges the bitline, the voltage swing is sensed with respect to $V_{DD}/2$. A drawback of such voltage sensing is that memory cells are not optimized for discharging large bitline capacitances, so the time needed to produce a voltage swing adequate for sensing slows down the access time.

Rather than using a voltage reference to sense stored data, the present invention generates a current reference that tracks cell current $I_{BIT}$ over a range of temperatures and power supply values, which allows current mode sensing. With current mode sensing, the bitline voltage swing can be reduced to improve the speed of the memory circuit.

Figure 4:
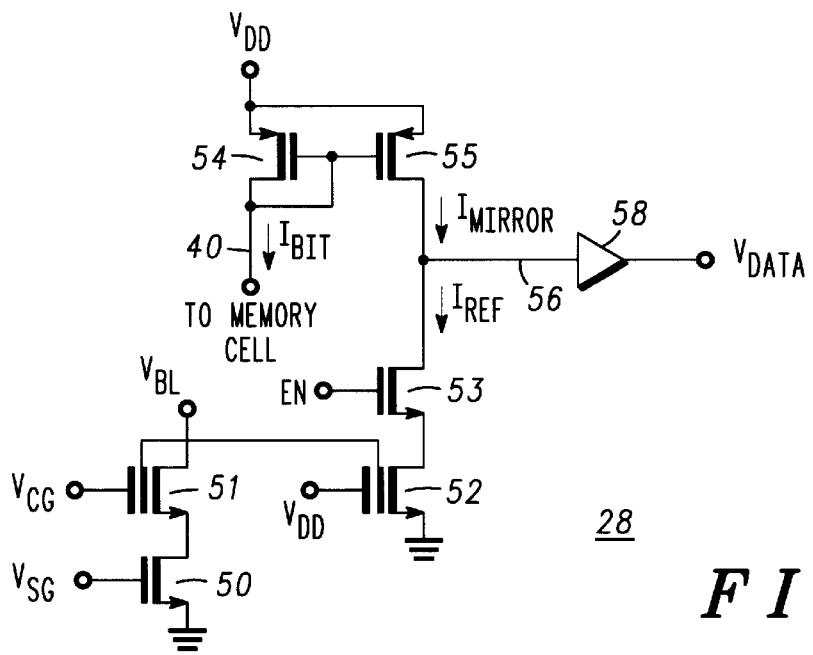
FIG. 4 is a schematic diagram of a sense amplifier.

FIG. 4 is a schematic diagram of sense amplifier 28 including transistors 50–55 and a buffer amplifier 58. Sense amplifier 28 is enabled by a control signal EN which switches on transistor 53 to provide a current path from transistor 52 to node 56.

Sense amplifier 28 operates as a current mode sense amplifier having an input at node 40 for receiving current $I_{BIT}$ from memory cell 30. Node 40 is highly capacitive due to the common drain connection of bitline multiplexer 26 and the memory cells coupled to bitline 39. Transistors 54–55 combine with buffer amplifier 58 to convert $I_{BIT}$ to an output signal $V_{DATA}$ representing the data stored in memory cell 30.

Transistors 54–55 are matching transistors operating as a current mirror receiving $I_{BIT}$ at an input and producing a proportional current $I_{MIRROR}$ at node 56. In one embodiment, transistor 55 is twice the size of transistor 54, so that $I_{MIRROR}=2*I_{BIT}$. The diode coupling of transistor 54 provides a low impedance on node 40 to minimize the voltage swing when $I_{BIT}$ changes.

Transistors 50 and 51 are configured to match transistors 34 and 36 of memory cell 30, respectively, in order to provide transistor 51 with a programming characteristic similar to transistor 36. The gate of transistor 50 receives a select signal $V_{SG}$, which can be used as an enable signal for sense amplifier 28. As an alternative embodiment, transistor 50 can be omitted, in which case the source electrode of transistor 51 is coupled to ground potential.

Transistors 51 and 52 are floating gate transistors fabricated to match transistor 36 of memory cell 30 in order to provide similar operation. The floating gates of transistors 51–52 are commonly coupled so that a portion of the programming charge is stored on the floating gate of transistor 51 and another portion is stored on the floating gate of transistor 52. The control gate of transistor 51 is shown as being coupled to $V_{CG}$ and the control gate of transistor 52 is shown as being coupled to $V_{DD}$. As an alternative, the control gates of transistors 51 and 52 can be commonly coupled to a bias voltage such as $V_{CG}$ in order to provide accurate conduction threshold measurements during test or programming and to reduce noise on the control gates.

Where the standard transistors of memory circuit 110 have breakdown voltages lower than the programming voltages, the common floating gate configuration allows transistor 51 to receive the high voltage programming signals while transistor 52 interfaces with low voltage circuitry. Hence, high voltage programming signals applied to transistor 51 produce a stored charge in transistor 52. The stored charge modulates the conduction of transistor 52 to produce a desired reference current $I_{REF}$ at the drain of transistor 52.

Programming of transistors 51–52 to set a desired level of $I_{REF}$ typically occurs during testing of the integrated circuit. In one procedure, a representative memory cell is programmed to fully charge the floating gate to produce bit current $I_{BIT}$ which is measured and recorded by the tester. Transistor 51 is then programmed while monitoring $I_{REF}$ at the drain of transistor 52. When $I_{REF}$ reaches a desired level, programming terminates and the stored charge of transistor 52 is retained after power is removed. Transistor 52 thereby operates as a nonvolatile current source whose conduction produces $I_{REF}$ at a drain. For example, $I_{REF}$ can be set to a midpoint value of $I_{MIRROR}/2$ to provide maximum noise immunity for sensing whether memory cell 30 is programmed to supply current levels of zero or of $I_{BIT}$. It should be noted that $I_{REF}$ can be adjusted to minimize read access time or current drain, or to fine tune another parameter of memory circuit 110. Because transistors 51 and 52 are fabricated to match transistor 36, $I_{REF}$ and $I_{BIT}$ exhibit similar performance as the temperature and power supply voltage varies.

Node 56 operates as a comparing node that compares $I_{MIRROR}$ to $I_{REF}$ to produce a voltage swing that is amplified by buffer amplifier 58 to produce output signal $V_{DATA}$. Buffer amplifier 58 may have an internal threshold set to the midpoint of the voltage swing at node 56, such as $V_{DD}/2$. Because node 56 is a low capacitance node, voltage transitions occur more rapidly than comparable transitions at node 39 or 40. Therefore, current mode sensing is a method of transferring voltage transitions from high capacitance nodes to lower capacitance nodes to increase speed.

Figure 5:
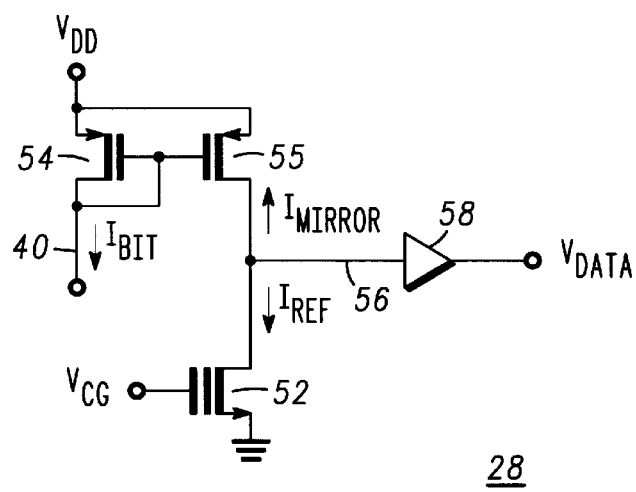
FIG. 5 is a block diagram of another sense amplifier.

FIG. 5 is a schematic diagram of an alternate embodiment of sense amplifier 28 including transistors 52–55 and buffer amplifier 58 for use when component isolation from high programming voltages is not needed. Transistor 52 is a floating gate transistor matching memory cell transistor 36. Programming signals can be applied directly to transistor 52 using switches (not shown). Because other components can withstand the programming voltages, damage does not occur. Operation is similar to that of the embodiment shown in FIG. 4, and provides a similar benefit of current mode sensing. Diode coupled transistor 54 produces a low impedance to limit the voltage excursion of node 40. Mirror transistor 55 produces current $I_{MIRROR}$ proportional to $I_{BIT}$. Node 56 is a high impedance, low capacitance node which can have a large voltage swing without contributing excess delay in sensing cell data.

Figure 6:
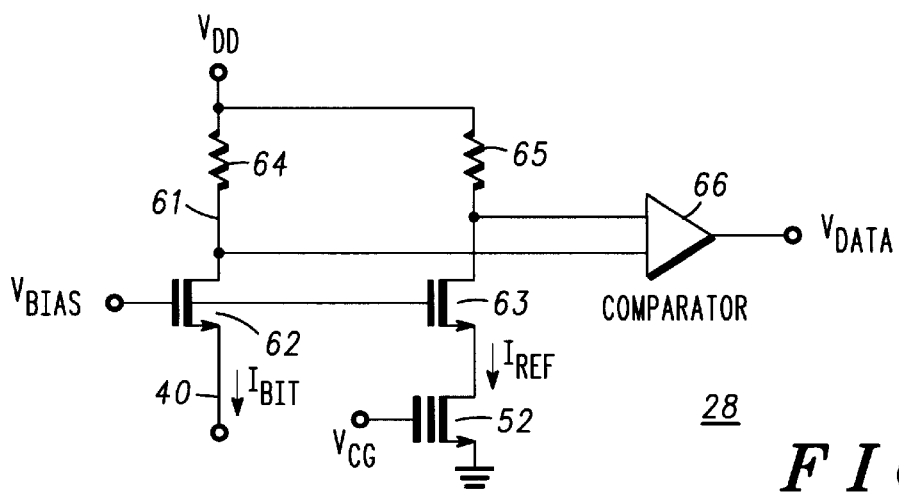
FIG. 6 is a schematic diagram of yet another sense amplifier.

FIG. 6 is a schematic diagram of yet another embodiment of sense amplifier 28 including transistors 52, 62 and 63, resistors 64–65 and comparator 66. Transistor 52 is a floating gate transistor whose operation and programming are similar to what is shown and described in FIG. 4. Transistors 62–63 operate as source followers biased to a voltage $V_{BIAS}$. The source of transistor 62 produces a low impedance to limit the voltage swing at node 40. In effect, transistor 62 decouples the capacitance of node 40 from node 61 to allow a voltage transition at node 61 without excessively degrading read access time.

Typically, $I_{BIT}=2*I_{REF}$ and resistor 64 is equal to resistor 65, so that reference voltage is developed across resistor 65 for comparing with a voltage developed across resistor 64 by $I_{BIT}$. The comparison is performed by comparator 66 to produce $V_{DATA}$ at the output.

The sensing structures shown in FIGS. 4–6 increase the performance of a memory circuit by limiting voltage swings of high capacitance nodes while allowing faster low capacitance nodes to make the voltage transitions for sensing. It should be noted that each of the embodiments shown in FIGS. 4–6 can be implemented using a single floating gate transistor as a programming transistor or can use a two transistor arrangement similar to memory cell 30 as a programming circuit. In each case, the floating gate of the programming device is coupled in common with the floating gate of the transistor which is to share the charge.

The present invention makes current mode sensing practical by generating a reference current that tracks the memory cell bit current over a range of expected temperatures and power supply voltages. The reference current is produced by a reference floating gate transistor that matches floating gate transistors in the memory cells. The reference transistor is set to an intermediate, or analog, current level by adjusting the programming time.

Figure 7:
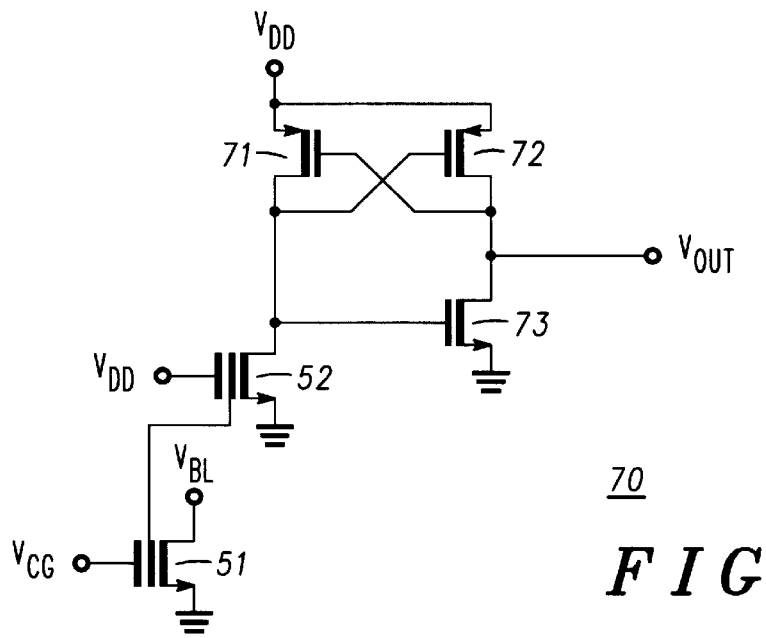
FIG. 7 is a schematic diagram of a nonvolatile register.

FIG. 7 is a schematic diagram of a nonvolatile register 70 for use in setting a sense amplifier reference current with digital methods. Register 70 includes floating gate trarsistors 51–52 and transistors 71–73. In the embodiment of FIG. 7, transistors 51–52 are configured with a common floating gate to allow transistor 51 to be programmed while sharing the resulting stored charge with transistor 52 in a manner previously described. Hence, the high voltage programming signals applied to transistor 51 are isolated from the circuitry of register 70 to allow transistors 71–73 to be low voltage transistors, which reduces die size and improves speed.

Register 70 operates as a digital storage element, so that transistor 52 is either fully charged or has no charge, i.e., transistor 52 is programmed to be either on or off. For example, if transistor 52 is programmed on, the latch comprising transistors 71–72 is set so that $V_{OUT}$ has a logic high state. If transistor 52 is programmed off, the latch comprising transistors 71 72 is reset so that $V_{OUT}$ has a logic low state. Because transistor 52 is nonvolatile, the logic state of register 70 is retained even after power is removed.

Figure 8:
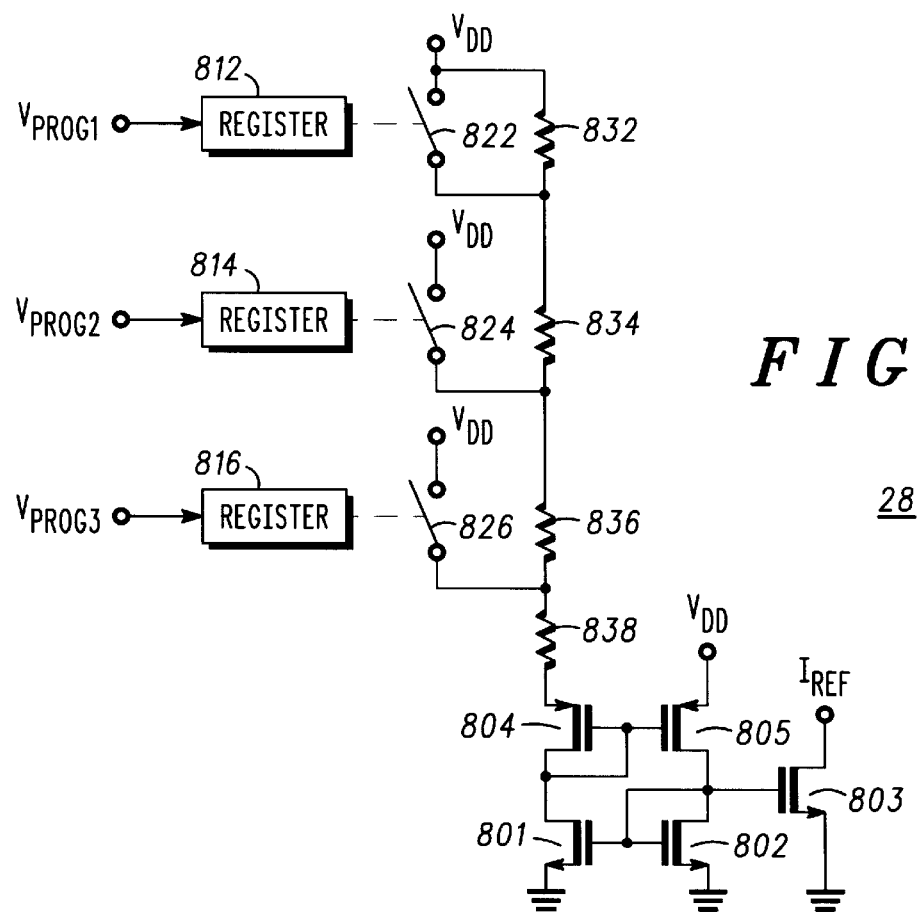
FIG. 8 is a schematic diagram of a reference current generator.

FIG. 8 is a schematic diagram of a reference current generator using a digital method to set $I_{REF}$, including transistors 801–805, nonvolatile registers 812–816, switches 822–826 and resistors 832–838. Registers 812–816 are nonvolatile registers similar to register 70 shown in FIG. 7 for storing one bit of nonvolatile information. $V_{PROG1}$, $V_{PROG2}$ and $V_{PROG3}$ represent programming signals used to program the floating gate transistors of registers 812–816 to control switches 822–826, which are implemented with switching transistors or transmission gates. Switches 822–826 combine with resistors 832–836 to produce a programmable resistance $R_{PROG}$ at the source of transistor 804 to set the current level.

Transistors 801–803 are NMOS transistors with matched geometries for operating as a current mirror such that equal currents $I_{REF}$ flow through each transistor, forcing equal currents $I_{REF}$ to flow through transistors 804–805. Transistors 804–805 are PMOS transistors having ratioed but unequal geometries such that transistors 804 and 805 have different gate-to-source voltages when $I_{REF}$ flows into each transistor. For example, transistor 804 can be ten times larger than transistor 805 such that the gate-to-source voltage $V_{GS804}$ of transistor 804 is 100.0 millivolts less than the gate-to-source voltage $V_{GS805}$ of transistor 805 when $I_{REF}$ flows through each transistor. The voltage difference $V_{GS804}-V_{GS805}=100.0$ millivolts is developed across $R_{PROG}$ to set the level of $I_{REF}$ in accordance with the following equation.

$$I_{REF}=(V_{GS804}-V_{GS805})/R_{PROG}=(100.0 \text{ millivolts})/R_{PROG}$$

Resistor 838 has a resistance R838 which establishes a maximum value for $I_{REF}$ when switches 822–826 are all closed such that $R_{PROG}=R_{838}$. Transistor 803 supplies $I_{REF}$ to a sense amplifier for sensing stored data.

The desired level of $I_{REF}$ is programmed using a digital method analogous to the analog method described earlier. In particular, a representative memory cell is programmed to fully charge the floating gate and the cell current $I_{BIT}$ is measured. $I_{REF}$ is monitored at the drain of transistor 803 while programming signals $V_{PROG1}$ to $V_{PROG3}$ are applied as appropriate to registers 812–816 to adjust the value of $R_{PROG}$ to set the desired level of $I_{REF}$.

In summary, it should be evident that the present invention provides a circuit and method of sensing data stored in an integrated circuit. Performance is improved while reducing power consumption by providing a current reference that tracks memory cell current over a range of temperatures and power supply voltages. Such tracking allows memory cell current, rather than voltage, to be sensed and compared with the reference current to produce the stored data. The reference current is set by applying programming voltages to the reference device during testing of the integrated circuit. Performance of the integrated circuit can be fine tuned by adjusting the magnitude of the reference current during programming.

What is claimed is:

1. An integrated circuit, comprising:
   a first storage element for storing data and having an output for producing a storage current to a first node indicative of the data; and
   a second storage element having an output coupled to the first node for providing a reference current determined by a value stored in the second storage element that is less than a value of the data, where the reference current is compared to the storage current to sense the data stored in the first storage element.

2. The integrated circuit of claim 1, wherein the second storage element includes a first transistor having a floating gate for storing the value as a first charge that modulates a conduction of the first transistor for setting the reference current.

3. The integrated circuit of claim 2, wherein the first storage element includes a floating gate transistor for storing the data as a second charge, where the first charge is less than the second charge.

4. An integrated circuit, comprising:
   a first storage element for storing data and having an output for producing a storage current indicative of the data;
   a first transistor having a floating gate for storing a charge that modulates a conduction of the first transistor;
   a programmable resistor circuit having an output for providing an impedance controlled by the conduction of the first transistor; and
   a current mirror having an input coupled to the output of the programmable resistor circuit and producing a reference current as determined by the impedance for comparing to the storage current to sense the data stored in the first storage element.

5. An integrated circuit, comprising:
   a first storage element for storing data and having an output for producing a storage current indicative of the data;
   a current mirror having an input coupled to the output of the first storage element; and
   a second storage element having an output coupled to an output of the current mirror for providing a reference current determined by a value stored in the second storage element, where the reference current is compared to the storage current to sense the data stored in the first storage element.

6. The integrated circuit of claim 5, further comprising an amplifier having an input coupled to the first node for comparing the storage current with the reference current to produce an output signal representative of the data.

7. A method of sensing data stored in a memory circuit, comprising the steps of:
   generating a storage current indicative of the data stored in a first storage element;
   storing a value in a second storage element which determines a reference current; and
   mirroring the storage current to produce a mirrored current for comparing with the reference current to sense the data.

8. The method of claim 7, wherein the step of mirroring includes a step of reducing an impedance to reduce a voltage swing of the first storage element.

9. The method of claim 7, wherein the step of storing includes the steps of:
   charging a first node to store the value as a stored charge; and
   modulating a conduction of the second storage element with the stored charge to produce the reference current.

10. The method of claim 9, wherein the step of charging includes the steps of:
    charging the first node to produce a programming charge on the first node; and
    sharing the programming charge between the first node and a second node to produce the stored charge at the second node.

11. The method of claim 10, wherein the step of charging further includes the steps of:
    applying a programming signal to an input of the second storage element; and
    charging the first node with the programming signal.

12. The method of claim 11, wherein the step of sharing includes a step of isolating the programming signal from the second node.

13. The integrated circuit of claim 2, further comprising a second transistor having an input coupled for receiving a programming signal and a floating gate coupled to the floating gate of the first transistor for storing the first charge in response to the programming signal.

14. The integrated circuit of claim 3, wherein a potential developed with the first charge on the floating gate of the first transistor is less than a potential developed with the second charge on the floating gate of the floating gate transistor.

15. A method of sensing data stored in a memory circuit, comprising the steps of:
    generating a storage current indicative of the data stored in a first storage element;
    storing a value in a second storage element which is less than a value of the data to establish a reference current; and
    comparing the storage current to the reference current to sense the data.

16. A wireless communications device, comprising:
    a receiver circuit having an input coupled for receiving a radio frequency carrier signal and an output for producing digital data;
    a digital processing circuit for processing the digital data and producing an output signal;
    a memory circuit for storing and transferring the digital data to the digital processing circuit, where the memory circuit includes
    (1) a storage element for storing the digital data;
    (2) a transistor having a floating gate for storing a value less than a value of the digital data for modulating a conduction path of the transistor to provide a reference current to a first node; and
    (3) a current mirror having an input coupled to an output of the first storage element and an output coupled to the first node to provide a sense current for comparing to the reference current to sense the digital data.

* * * * *